(12) United States Patent
Di Stefano et al.

(10) Patent No.: US 10,024,903 B2
(45) Date of Patent: Jul. 17, 2018

(54) PARTIAL DISCHARGE DETECTION SYSTEM AND METHOD EMPLOYING A SYNTHETIZED SYNCHRONIZATION SIGNAL

(71) Applicant: PRYSMIAN S.P.A., Milan (IT)

(72) Inventors: Antonio Di Stefano, Milan (IT); Roberto Candela, Milan (IT); Giuseppe Fiscelli, Milan (IT)

(73) Assignee: PRYSMIAN S.P.A., Milan (IT)

( * ) Notice: Subject to any disclaimer, the term of this patent is extended or adjusted under 35 U.S.C. 154(b) by 105 days.

(21) Appl. No.: 15/032,228

(22) PCT Filed: Oct. 29, 2013

(86) PCT No.: PCT/EP2013/072569
§ 371 (c)(1),
(2) Date: Apr. 26, 2016

(87) PCT Pub. No.: WO2015/062628
PCT Pub. Date: May 7, 2015

(65) Prior Publication Data
US 2016/0274176 A1    Sep. 22, 2016

(51) Int. Cl.
*G01R 31/12*    (2006.01)
*G01R 31/14*    (2006.01)

(52) U.S. Cl.
CPC ..... *G01R 31/1272* (2013.01); *G01R 31/1227* (2013.01); *G01R 31/14* (2013.01)

(58) Field of Classification Search
CPC .............. G01R 31/14; G01R 31/12227; G01R 31/1254; G01R 31/1245; G01R 31/1272; H04B 3/54
See application file for complete search history.

(56) References Cited

U.S. PATENT DOCUMENTS

| 4,757,263 A | 7/1988 | Cummings, III et al. |
| 7,532,012 B2 * | 5/2009 | Cern ................... G01R 31/1272 324/536 |

(Continued)

FOREIGN PATENT DOCUMENTS

| EP | 2 579 056 | 4/2013 |
| JP | 6-11534 | 1/1994 |

(Continued)

OTHER PUBLICATIONS

International Search Report from the European Patent Office for International Application No. PCT/EP2013/072569, dated Jul. 21, 2014.

(Continued)

*Primary Examiner* — Minh N Tang
(74) *Attorney, Agent, or Firm* — Finnegan, Henderson, Farabow, Garrett & Dunner, L.L.P.

(57) ABSTRACT

A partial discharge detection system including a partial discharge acquisition and processing device includes: a partial discharge detection device configured to provide a detected partial discharge electrical signal from partial discharge pulse generated by a first electrical object; and a first communication module configured to receive a detected synchronization signal carrying detected synchronization phase values and corresponding reference time values associated with an electrical supplying voltage of a second electrical object. The partial discharge detection system further includes: a phase value generator configured to produce synthetized phase values representing a synthetized synchronization signal, the phase value generator being adjustable according to phase errors; and an error computing module configured to compute said phase errors from the synthetized phase values, the detected synchronization phase values and the corresponding reference time values.

20 Claims, 5 Drawing Sheets

(56) References Cited

U.S. PATENT DOCUMENTS

2010/0250159 A1    9/2010  Hall
2015/0054524 A1*   2/2015  Kobayashi ......... G01R 31/1227
                                                        324/551

FOREIGN PATENT DOCUMENTS

| JP | 2000-329813 | 11/2000 |
| JP | 2003-7551 | 1/2003 |
| JP | 2003-075501 | 3/2003 |
| WO | WO 2009/150627 | 12/2009 |

OTHER PUBLICATIONS

Candela et al.; "A Novel Partial Discharge Detection System Based on Wireless Technology", AEIT Annual Conference 2013, pp. 1-6, (2013).

\* cited by examiner

PARTIAL DISCHARGE DETECTION SYSTEM AND METHOD EMPLOYING A SYNTHETIZED SYNCHRONIZATION SIGNAL

CROSS REFERENCE TO RELATED APPLICATIONS

This application is a national phase application based on PCT/EP2013/072569, filed Oct. 29, 2013, the content of which is incorporated herein by reference.

BACKGROUND

Technical Field

The present invention relates to partial discharge detection systems and, particularly, to systems for detecting partial discharge pulses synchronized with an electrical supply voltage.

Description of the Related Art

Partial discharge detection is particularly used for identifying and measuring partial discharges in electrical components and apparatus, such as: medium, high or extra-high voltage cables, cable joints, overhead line insulators, medium and high voltage switchboard boxes, high and extra-high voltage cables using GIS (Gas Insulated Switchgear), substations, transformers, motors.

The term partial discharges is intended to indicate an undesired recombination of electric charges occurring in the dielectric (insulating) material of electric components, when the latter have defects of various types, eventually leading to dielectric destruction. Here, a pulse current is generated in portions of dielectric material and causes an electromagnetic wave to propagate through the power or ground cables of the relevant electric system, and radiating through the various surrounding media (dielectric material, metals, air, etc.).

For executing partial discharge measurements on AC (Alternate Current) electrical components it is important to have a phase reference signal, i.e. a signal that is synchronized in phase and frequency with the AC voltage powering the electrical component. Useful diagnostic figures are obtained by plotting the maximum amplitude of the partial discharge pulses versus the phase of the supply voltage when they occurred.

In some cases, sensing the AC supply voltage to obtain its phase angle implies using specific sensors that have to be connected to the components under test. This operation in general requires the component to be disconnected from its supply (shut off) and then reconnected: this operation is often impractical, has high indirect costs, and cannot be done at all in many cases.

Document WO-A-2009-150627 describes, inter alia, a partial discharge detection device of small size, totally insulated and self-powered, which allows measurements to be performed with the highest safety with no need for direct connection to the system under examination. The device comprises a wide-band antenna adapted to act as an electric field sensor and including a first planar conductor (i.e. a ground plane) cooperating with a second conductor whose profile converges towards the first planar conductor at one point or one line. This partial discharge detection device can also detect a synchronization signal, which is obtained by picking up the supply voltage of the discharge generating components.

There are practical conditions in which the detection of the supply voltage of a partial discharge generating component can be performed neither in contact nor in contactless technologies on the partial discharge generating component but it has to be performed on another electrical component and remotely from the component under test.

Document JP-A-6-11534 discloses a partial discharge measuring system comprising a solenoid coil detection part which is provided at a power cable which is laid in a ductwork inside an underground manhole, the output signal is detected by a partial discharge detection part and then the detection signal is transmitted to the antenna of a manhole lid by a detection signal transmission part. A DC regulation power supply receives power from the cable by a transformer for receiving power supply. The applied voltage phase information of the cable is transmitted on the electric wave of a mobile telephone from a transmission terminal side substation provided with a voltage transformer. A partial voltage and applied voltage phase reception device which is provided near the manhole lid is provided with a radio signal reception part and a telephone signal reception antenna, obtains the partial discharge signal of the power cable under test and the applied voltage phase information signal, and then analyses the partial discharge pulse with the applied voltage phase as parameters.

Document JP200307551 describes a technique according to which a radio wave having a time signal sent by a GPS satellite is received at a partial discharge signal detecting part and at an application voltage signal detecting part. This time signal and the signals detected by the application voltage signal detecting part and by the partial discharge signal detecting part are recorded.

BRIEF SUMMARY OF THE INVENTION

The Applicant experienced that a synchronization signal detection apparatus is necessary for referencing the partial discharge detection to the phase of the electrical voltage powering the electric object under test. In some instances, the detection of the AC supply electrical voltage is performed remotely with respect to the apparatus detecting the partial discharge pulses and the detected AC supply electrical voltage is transmitted towards the partial discharge signal apparatus. This transmission of the detected AC supply electrical voltage makes difficult effectively implementing the synchronization between the two detected signals since the remotely detected synchronization signal (corresponding to the AC supply electrical voltage) reaches the partial discharge apparatus with a time delay which does not allow a real-time synchronization with the partial discharge detected signal.

The Applicant found that synthetized phase data reproducing the pattern of a remotely detected AC electrical voltage can be used to synchronize the partial discharge detected signal with the phase angle of the AC supply voltage, provided that the synthetized phases are adjusted basing on samples of the remotely electrical AC electrical voltage.

According to a first aspect, the present invention relates to a partial discharge detection system comprising a partial discharge acquisition and processing device comprising:

a partial discharge detection device configured to provide a partial discharge detected electrical signal from partial discharge pulse generated by a first electrical object;

a first communication module configured to receive a detected synchronization signal carrying detected synchronization phase values and corresponding reference time values associated with an electrical supplying voltage of a second electrical object;

a phase value generator configured to produce synthetized phase values representing a synthetized synchronization signal, the phase value generator being adjustable according to phase errors;

an error computing module configured to compute said phase errors from the synthetized phase values, the detected synchronization phase values and the corresponding reference time value.

In an embodiment of the invention, the error computing module is configured to compute a current phase error from a past detected synchronization phase value associated with a past reference time value and a comparison value. The partial discharge acquisition and processing device further includes: a time shifter module configured to select, among the synthetized phase values, a past synthetized phase value generated at said past reference time value and provide said past synthetized phase value as comparison value to the error computing module.

In an embodiment of the invention, the partial discharge detection system further comprises a synchronization detection apparatus comprising:

a sensor module to convert the electrical supplying voltage in a converted electrical signal;

a synchronization processing module structured to receive the converted electrical signal and generate said detected synchronization signal by associating the detected synchronization phase values to the corresponding reference time values;

a second communication module configured to transmit said detected synchronization signal along a communication network connectable to said first communication module.

In an embodiment of the invention, the partial discharge detection system further comprises a time reference source structured to provide a time reference signal to the partial discharge acquisition and processing device and the synchronization detection apparatus to generate said reference time values. Said time reference source can be one of the following sources: GPS (Global Positioning System) time source, stable oscillator time source, IEEE 1588 network time source.

In an embodiment of the invention, the partial discharge acquisition and processing device is placed remotely from the second electrical object. The partial discharge acquisition and processing device comprises: an acquisition device configured to process the detected partial discharge electrical signal and provide partial discharge amplitude.

In accordance with a particular embodiment, the sensor module of the synchronization detection apparatus is one of the following devices: voltage transformer, capacitive coupler. The partial discharge detection device can be one of the following sensors: contact sensor, contactless sensor, Rogowsky sensor, coupler transformer type magnetic sensor, magnetic field proximity sensor, acoustic sensor, piezoelectric sensor, antenna sensor.

In an embodiment of the invention, the partial discharge acquisition and processing device further comprises a first local clock generator configured to produce from the time reference signal a timing signal to synchronize the acquisition device and the synchronization detection apparatus comprises a second local clock generator configured to produce said reference time values from the time reference signal.

In an embodiment of the invention, the partial discharge detection system further comprises a display connected to the partial discharge acquisition and processing device and configured to display said partial discharge amplitude values at corresponding the synthetized phase values. In a particular embodiment, the partial discharge acquisition and processing device further includes a filtering module configured to filter the phase errors reducing abrupt phase transition in the synthetized phase values produced by the phase value generator.

In accordance with an embodiment, the adjustable phase value generator is configured to generate a periodic digital waveform having the frequency of said electrical supplying voltage and, particularly, the phase value generator is a direct digital synthesizer (DDS), configured to generate a signal with a frequency in the range 0.01 Hz to 10 KHz.

The communication network (NTW) can be at least one of the following networks: a packet network, a LAN (Local Area Network), a WAN (Wide Area Network), Ethernet, WiFi, GSM (Global System for Mobile communication)/3G network.

In accordance with a second aspect, the present invention relates to a partial discharge detection method comprising, at a first processing apparatus:

detecting a partial discharge pulse generated by a first electrical object and providing a detected partial discharge electrical signal;

receiving a detected synchronization signal carrying detected synchronization phase values and corresponding reference time values associated with an electrical supplying voltage of a second electrical object;

generating a plurality of synthetized phase values representing a synthetized synchronization signal;

computing phase errors from the synthetized phase values, the detected synchronization phase values and the corresponding reference time values;

adjusting phases of the plurality of synthetized phase values according to the phase errors.

In accordance with a specific embodiment, the detection method further includes: selecting among the plurality of synthetized phase values a past synthetized phase value generated at said past reference time value; wherein computing said phase errors includes computing, at a current time, a current phase error from a past detected synchronization phase value associated with a past reference time value and said past synthetized phase value.

In an embodiment of the invention, the detection method includes, at a second processing apparatus:

converting the electrical supplying voltage in a converted electrical signal;

receiving the converted electrical signal and generating said detected synchronization signal by associating the detected synchronization phase values to the corresponding reference time values;

transmitting towards said processing apparatus said detected synchronization signal along a communication network.

In accordance with a particular embodiment, the detection method further comprises:

processing the detected partial discharge electrical signal and providing partial discharge amplitude values, displaying said partial discharge amplitude values at corresponding the synthetized phase values.

BRIEF DESCRIPTION OF THE DRAWINGS

Further characteristics and advantages will be more apparent from the following description of a preferred embodiment and of its alternatives given as a way of an example with reference to the enclosed drawings in which.

DETAILED DESCRIPTION

Figure 1:
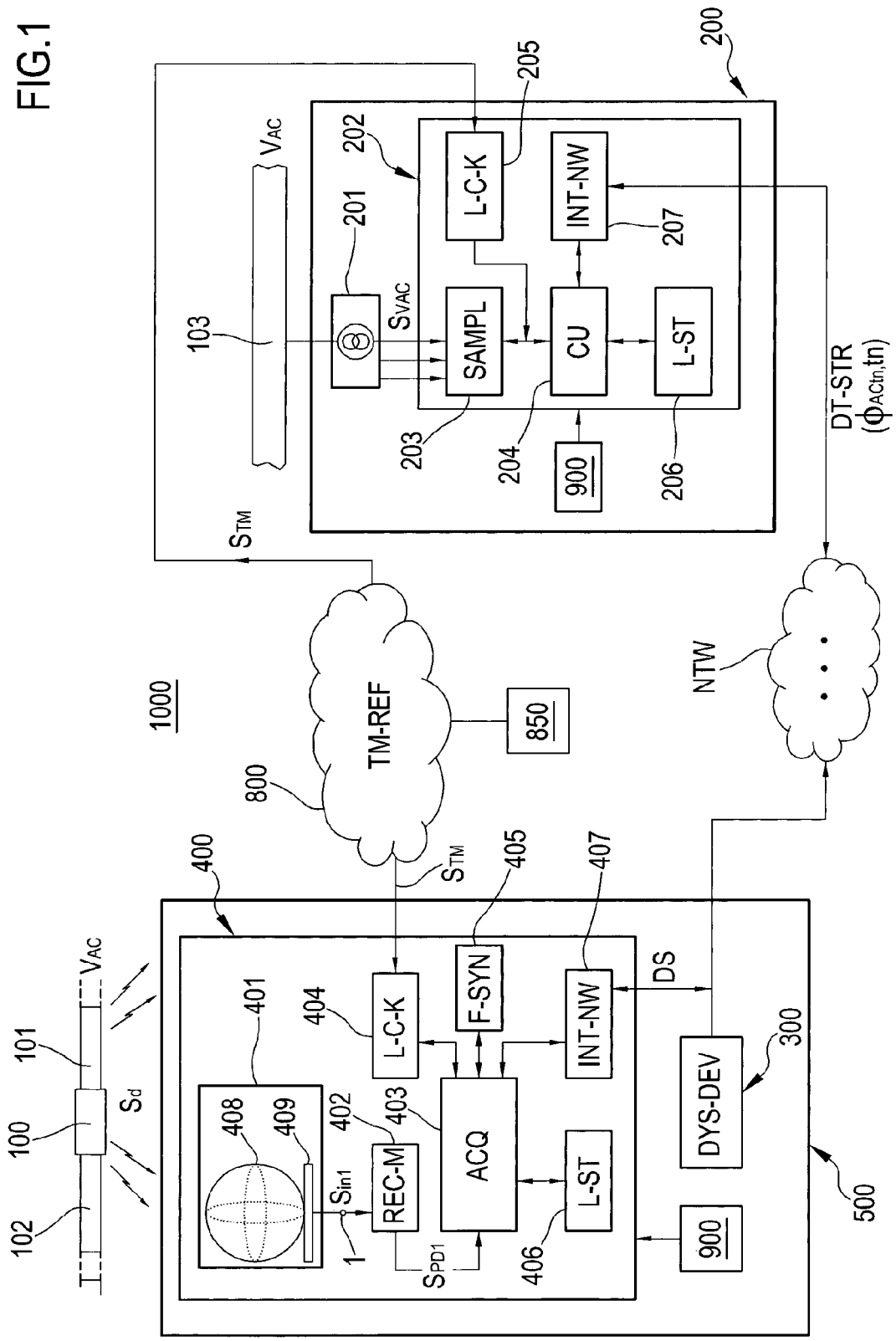
FIG. 1 shows an example of a partial discharge detection system comprising a partial discharge acquisition and visualization apparatus and a synchronization detection apparatus.

In the following description, same alphanumeric references are used for analogous exemplary elements when they are depicted in different drawings. FIG. 1 shows a partial discharge detection system 1000 comprising a first electrical object 100 and at least one partial discharge acquisition and visualization apparatus 500 which includes an acquisition and processing device 400 and a display 300 (DYS-DEV). The partial discharge acquisition and visualization apparatus 500 is an electronic apparatus employable to detect, measure and/or analyse partial discharges generated by electrical sources, as the electrical object 100 itself. The acquisition and processing device 400 can be portable and includes one or more batteries.

In accordance with an example, the first electrical object 100 is a cable joint or a cross-bond joint which joints a first electrical cable 101 with a second electrical cable 102. The first electrical cable 101 is fed with an AC (Alternate Current) electrical voltage $V_{AC}$. Typically, AC electrical voltage $V_{AC}$ has a frequency comprised between 1 Hz to about 1000 Hz. The cable joint 100 can produce partial discharge electromagnetic impulsive signals $S_d$.

The partial discharge detection system 1000 also shows a second electrical object 103 and at least one synchronization detection apparatus 200. The synchronization detection apparatus 200 can be portable and includes one or more batteries As an example, the second electrical object 103 is another electrical cable or a medium or high voltage termination (MV/HV termination), which is connected to a transmission or distribution electrical network connected also to the first electrical object 100. So the second electrical object 103 is fed with an AC electrical voltage $V_{AC}$ having the same characteristics in time (i.e. sinusoidal shape, frequency and phase) of the AC electrical voltage feeding the first electrical object 100. The second electrical object 103 can be adapted to produce and irradiate a first electromagnetic signal $S_{ES1}$ generated by and synchronized with the AC electrical voltage $V_{AC}$. The synchronization detection apparatus 200 is configured to detect the AC electrical voltage $V_{AC}$ feeding the second electrical object 103 and generate corresponding digital data representing the AC electrical voltage $V_{AC}$ to be provided to the partial discharge acquisition and visualization apparatus 500. Particularly, the synchronization detection apparatus 200 and the partial discharge acquisition and visualization apparatus 500 are remote each other. As an example, the synchronization detection apparatus 200 can be placed at a distance from the partial discharge acquisition and visualization apparatus 500 included in the range 1 m to 1000 km.

In FIG. 1 is also represented a time reference source 800 (TM-REF) which is, particularly, external to the partial discharge acquisition and visualization apparatus 500 and the synchronization detection apparatus 200. The external time reference source 800 is a precision absolute time source that can be accessed, substantially without skew or drift, in different and distant geographical locations. In accordance with a first and preferred embodiment, the time reference source 800 is a time source of a GPS (Global Positioning System) or other satellite positioning system such as an example, GLONASS and GALILEO which irradiate a time reference signal $S_{TM}$. The GPS system has a theoretical accuracy of about 10 ns and is available worldwide, moreover it is relatively inexpensive. GPS receivers provide a text string containing the universal date and time (UTC), and a pulse signal (called 1PPS) every second that has a rising edge placed at the exact beginning of the universal second. As also described hereinafter, the partial discharge acquisition and visualization apparatus 500 and the synchronization detection apparatus 200 are provided with a respective GPS receiver. The overall precision achievable with a satellite positioning system is well below 1 µs that is a very good resolution, considering that it corresponds to an angle of 0.018° for a 50 Hz signal and 0.022° for a 60 Hz one.

In accordance with another embodiment, the time reference source 800 can be a computer network defining a synchronization time signal used to synchronize the computers/devices of the network. As an example, the time reference source 800 is associated with an IEEE 1588 compliant network. This standard and associated systems allow a precise synchronization (also below 1 µs) among devices connected to the same network. This is generally applied to wired Local Area Network (LAN), but can also be employed over wider networks with slightly decreased performances. Using IEEE 1588 method can be a preferred synchronization method when GPS signal is not available. The IEEE 1588 network can also advantageously used as an additional time reference source 850 in conjunction with the GPS time reference source 800, for example to bring the time signal in underground locations. In these cases the GPS synchronization signal is connected to the IEEE 1588 local network 850 for synchronizing it with the universal time, and the network is used to carry the signal without skew to the devices to be synchronized. It has to be noted that IEEE 1588 or similar simplified protocols can be advantageously implemented on fiber optic links that can easily span for some tens of kilometres.

In accordance with a third embodiment, that can be employed within short distances and times, the time reference source 800 can comprise a stable oscillator included into the partial discharge acquisition and visualization apparatus 500 and another stable oscillator included into the synchronization detection apparatus 200 that are synchronized before performing the measures of the PD signals and the synchronization signals. The two stable oscillators can also be employed as additional time reference sources 900.

Reference is now made to the synchronization detection apparatus 200 which comprises a sensor module 201 and a synchronization processing module 202. The sensor module 201 includes, as an example, one or more voltage sensors, such as voltage transformers or capacitive couplers. Particularly, the sensor module 201 can include three voltage sensors each connected to one of the electrical phases of the second electrical object 103. The sensor module 201 is configured to provide at least one electrical signal $S_{VAC}$ representative of the AC electrical voltage $V_{AC}$.

In accordance with the described example, the synchronization processing module 202 includes a sampling device 203 (SAMPL), a control unit 204 (CU), a first local clock 205 (LCK) a first local storage module 206 (LST) and a first network interface module 207 (INT-NW). The sampling device 203 is configured to sample the electrical signal $S_{VAC}$ with a suitably frequency, preferably greater than 1000 times the frequency of the AC electrical voltage $V_{AC}$ feeding the second electrical object 103 (so obtaining a phase resolution of at least 1 degree), and generate a digital signal.

Particularly, the control unit 204, by means of a processing module, is configured to process the digital signal carrying the sampled data to precisely detect zero crossings and period of the electrical signal $S_{VAC}$. Particularly, the control unit 204 is configured to determine a list of detected synchronization phase values $\Phi_{ACtn}$, i.e. phase values of the electrical signal $S_{VAC}$ and so corresponding to the phase values of the AC electrical voltage $V_{AC}$. According to a particular embodiment, the processing executed by the control unit 204 can also perform low pass filtering or band pass filtering to remove harmonics or noise.

The first local clock 205 is structured to provide the control unit 204 with a digital data, hereinafter called "timestamp" representing a current time value $t_n$. According to the described embodiment, the first local clock 205 is a precise clock and can be implemented as a digital counter running at a frequency included as an example, into the range 1 MHz-100 MHz) and is synchronised with the time reference source 800. If the time reference source 800 is a GPS source, the first local clock 205 is connected to a GPS receiver (not shown in the figures) to extract the time reference signal $S_{TM}$ to be used to synchronize the first local clock 205.

The first local clock 205 preferably comprises a slow timer and a fast timer. The slow timer is usually 32 bit wide and counts in seconds and contains the date and time coded as number of seconds from a given epoch. In particular, the Unix epoch (1 Jan. 1970) is employed, but other are possible depending on the time reference used. The fast timer is also a counter, usually 32 bit wide, that is incremented at a very fast rate, in general from few nanoseconds (e.g. 5-10 ns) to 100 ns, and is used to measure fractions of a second. The slow counter is incremented by the overflow of the fast counter, i.e. once the sum of increment of the fast counter reaches 1 second (e.g. 10,000,000 in increment of 100 ns), it is reset and the slow counter is incremented by 1. Preferably, the first local clock 205 is clocked by a local quartz crystal oscillator showing short term stability. This implies that the first local clock 205 it is able to keep the correct time with respect to the time reference source 800 for several seconds or minutes. In order to obtain a better precision the clock can be periodically adjusted (e.g. once every 1 or 2 seconds) according to the time reference signal $S_{TM}$ provided by the time reference source 800. It is also observed that the control unit 204 is configured to associate each detected synchronization phase value $\Phi_{ACtn}$ to a corresponding timestamp $t_n$ provided by the first local clock 205.

The first local storage module 206 is structured to store a subset of the sampled data (usually ranging from a few per period to a few per second) with their associated timestamp. Particularly, the first local storage module 206 is configured to store the detected synchronization phase value $\Phi_{ACtn}$ their timestamps $t_n$ and optionally the instantaneous amplitude values of the AC voltage. The first local storage module 206 also allows subsequent retrieving of the stored data.

The first network interface module 207 is configured to connect the synchronization detection apparatus 200 to a computer network NTW such as: a packet network, a LAN (Local Area Network) or a WAN (Wide Area Network) network. The first network interface 207 can be an Ethernet, WiFi or GSM/3G modem. Particularly, the first network interface module 207 can be structured to allow the synchronization detection apparatus 200 to act as a server so to be remotely requested to initiate a data stream for one of the available inputs, or to send stored data. For the data streaming the UDP protocol is preferably employed.

In accordance with another embodiment, the synchronization detection apparatus 200 can be a commercially available synchrophasor to perform the required data acquisition, while streaming and storing the data can be performed with specific add-on circuit. Synchrophasors provide phase and amplitude information for voltage and current on a line at regular sampling intervals, synchronized with a global time reference. According to the IEEE 1344 standard (and forthcoming revisions), such a synchrophasor should also feature an error below 1 µs.

In accordance with the described embodiment, the acquisition and processing device 400 (FIG. 1) comprises a partial discharge sensor 401, a receiving module 402 (REC-M), an acquisition device 403 (ACQ), a second local clock 404 (LCK), a controlled frequency synthesizer 405 (FSYN), a second local storage module 406 (LST) and a second network interface module 407 (INT-NW).

The partial discharge sensor 401 is adapted to detect the discharge signals $S_d$ and convert it into a received electrical signal $S_{in}$ (e.g. an electrical current) available on a first output terminal 1. The partial discharge sensor 401 can be a contact sensor or a contactless sensor. A contact sensor is put in contact or in proximity with the first electrical apparatus 100 while a contactless or wireless sensor is adapted to perform a remote detection, i.e. without wires or cables connecting the source and the sensor device and without physical contact. As an example, the remote detection can be performed at a distance from the signal source of from 1 cm to 10 m. Examples of contact sensors are: Rogowsky sensor and coupler transformer type magnetic sensor. Examples of contactless sensors are: magnetic field proximity sensor, acoustic sensor and piezoelectric sensor.

In accordance with the embodiment shown in FIG. 1, the partial discharge sensor 401 includes an antenna 408 which can be mounted, as an example, on a support structure 409. As a further example, the antenna 408 can be one of the following antennas: small patch antenna, loop antenna, dipole and ultra wideband antenna. Preferably, the antenna 408 is spherical shaped and includes a hollow sphere in electrically conducting material such as, for example, metal or polymer material. The spherical shaped antenna 408 shows, as an example, a diameter comprised between 3 and 30 cm, preferably comprised between 5 and 20 cm. Particularly, the antenna 408 can be analogous to that described in patent application WO-A-2009-150627. It is observed that the partial discharge sensor 401 can also include a sensor configured for detecting the AC electrical voltage.

The receiving module 402 is configured to perform filtering and amplification of the received electrical signal $S_{in}$ and so producing a first partial discharge signal $S_{PD1}$ to be supplied to the acquisition device 403. The acquisition device 403 is configured to perform the acquisition processing steps of the received electrical signal $S_{in}$ and synchronize the partial discharge pulses with the AC electrical voltage $V_{AC}$.

Figure 2:
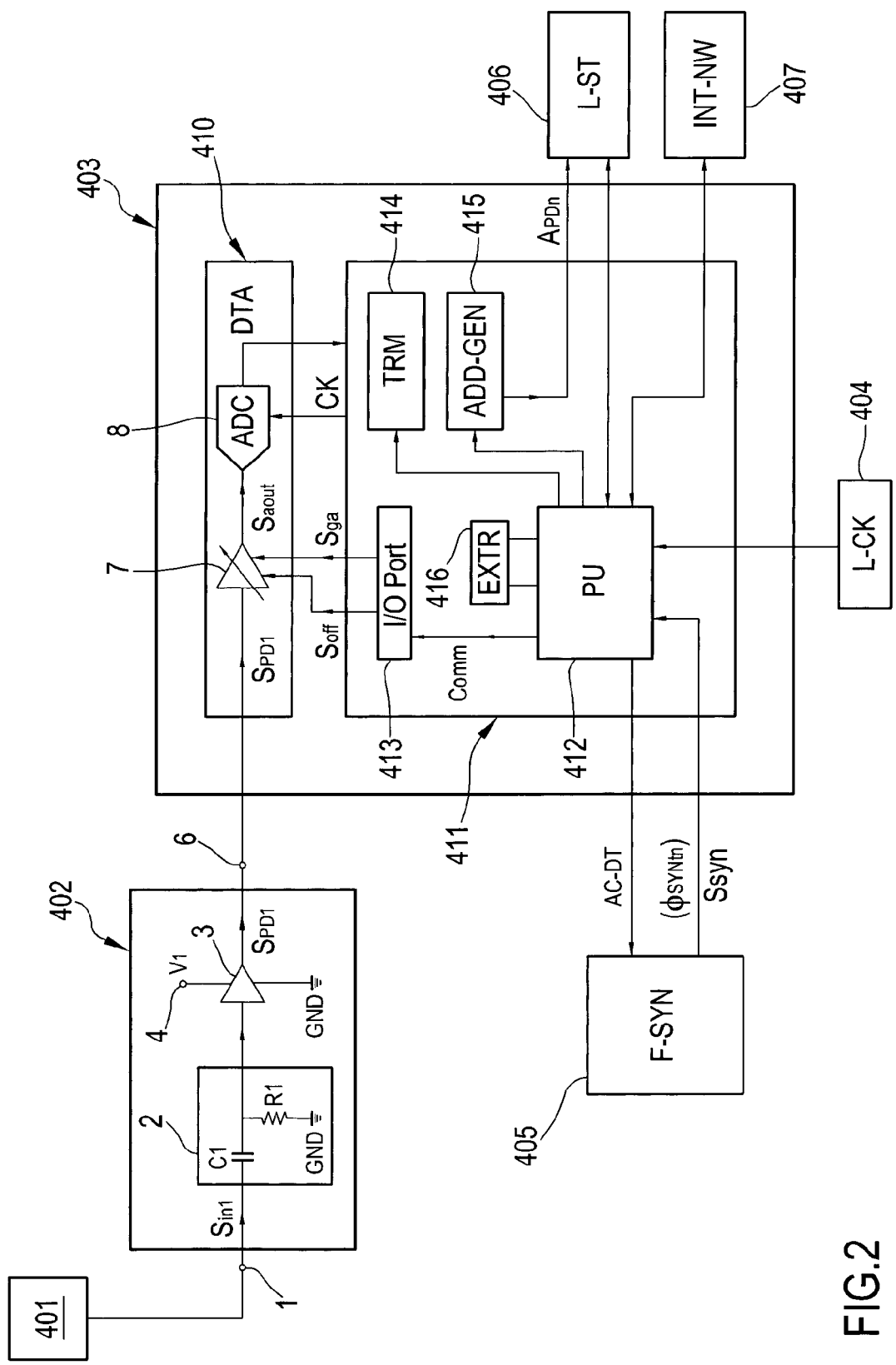
FIG. 2 shows an embodiment of an acquisition and processing device included in said partial discharge acquisition and visualization apparatus.

Particular examples of the receiving module 402 and of the acquisition device 403 are shown in FIG. 2. The receiving module 402 is structured as an analog front-end module and includes a high pass filtering module 2 and a first amplifier 3. The high pass filtering module 2 shows a respective input connected to the first output terminal 1, for the received electrical signal $S_{in}$ and is structured to remove low-frequency noise, such as signals having frequencies lower than 0.1 MHz. As an example, the high pass filtering module 2 can include a capacitor C1 connected to a resistor R1.

An output of the high pass filtering module 2 is connected to the first amplifier 3 having a second output terminal 6 to provide the first partial discharge signal $S_{PD1}$. As an example, another filter, such as band pass, band stop or low pass filter (not shown) can be connected to the output of the high pass filtering module 2 to obtain an overall band pass frequency response with desired characteristics. The first amplifier 3 is provided with a first supply terminal 4 for a supply voltage $V_1$ and a second supply terminal connected to a ground terminal GND. The first amplifier 3 shows, as an example, a bandwidth at least including the bandwidth of the antenna 408 such as an example, a bandwidth ranging from 0.1 MHz to 100 MHz.

The second local storage module 406, such as a RAM (Random Access Memory), is structured to store data received from synchronization detection apparatus 200 and the data provided by the acquisition device 403. The second local clock 404 and the second network interface 407 can be analogous to the first local clock 205 and the first network interface 207, respectively. Particularly, if the time reference source 800 is a GPS source, the second local clock 404 is connected to a GPS receiver (not shown in the figures) to extract the time reference signal $S_{TM}$ to be used to synchronize the second local clock 404.

The second network interface 407 and the first network interface 207 allow a communication between the acquisition and processing device 400 and the synchronization detection apparatus 200 via the network NTW.

The controlled frequency synthesizer 405 is structured to generate from data received by the synchronization detection apparatus 200 a plurality of synthetized phase values representing a synthetized synchronization signal $S_{syn1}$ to be used by the partial discharge acquisition and visualization apparatus 500 in analysing and plotting the partial discharge detected pulses. A particular embodiment of the controlled frequency synthesizer 405 will be described with reference to FIG. 3.

The acquisition device 403 schematically shown in FIG. 2 comprises a conversion module 410 and a digital processing module 411. The conversion module 410 comprises an optional wide band programmable amplifier 7 having an input connected to second output terminal 6 and a respective output connected to an analog-to-digital converter 8 (ADC). The digital processing module 411, as an example, a Field Programmable Gate Array (FPGA), is structured to control the wide band programmable amplifier 7 and receive data from the analog-to-digital converter 8. The wide band programmable amplifier 7 can be programmed to impart to the first partial discharge signal $S_{PD1}$ an offset value and an amplification gain value by means of offset signal $S_{off}$ and a gain signal $S_{ga}$ provided by the digital processing module 411, so producing an amplified output signal $S_{aout}$.

The wide band programmable amplifier 7 allows, as an example, a continuous gain variation ranging from about −5 dB to +40 dB. The analog-to-digital converter 8 is structured to be synchronised by a clock signal CK generated by the digital processing module 411 and generate digital converted data DTA to be sent to the digital processing module 411. The analog-to-digital converter 8 is, as an example, capable of converting 250 mega-samplers per second with an 8 bit resolution. This sampling frequency allows acquiring the first partial discharge signal $S_{PD1}$ with a time resolution of 4 ns. It is observed that most partial discharge pulses are usually longer that 0.5 μs, the acquisition device 403 allows to acquire the pulse waveform and represent it with a number of samples comprised between 64 and 512.

Moreover, in accordance with an example, the digital processing module 411 comprises: a processing unit 412 (PU), input/out port 413, a trigger module 414 (TRM), an address generator 415 (ADD-GEN), an extraction module 416 (EXTR). The input/out port 413 allows transferring output commands Comm generated by the processing unit 412 to the wide band programmable amplifier 7 under the form of the offset signal $S_{off}$ and the gain signal $S_{ga}$. The address generation module 415 is configured to generate the addresses necessary to write new data in the second local storage module 406 and read data stored in said second local storage module 406, under the control of the processing unit 412.

The trigger module 414 is configured to trigger the memorisation in the second local storage module 406 of samples of the amplified output signal $S_{aout}$ provided by the analog-to-digital converter 8 only for selected values of the amplified output signal $S_{aout}$ such as, for example, only for positive or negative pulses having amplitude (i.e. an absolute value) greater than a threshold level. The trigger logic module 414 can be a logic module operating under the control of the processing unit 412 and comprising one or more comparators to compare the values of the samples provided by the analog-to-digital converter with one or more thresholds.

The processing unit 412 can be configured to perform memorization in the second local storage module 406 of samples of the amplified output signal $S_{aout}$ selected by the trigger module 414 together the corresponding with timestamps $t_n$ provided by the second local clock 404. Moreover, the processing unit 412 is configured to control the memorization in the local storage module 406 of the phase values of the synthesised synchronization signal $S_{syn1}$ and their timestamps as available from the controlled frequency synthesiser 405.

The extraction module 416 (e.g. a co-processor), connected to the processing unit 412, is configured to perform extraction, particularly, real-time extraction of pulse features from the data stored in the local storage module 406. Examples of possible pulse features extracted by the co-processor are: peak value and polarity, phase, energy, duration and rough estimation of Weibull parameters.

Figure 3:
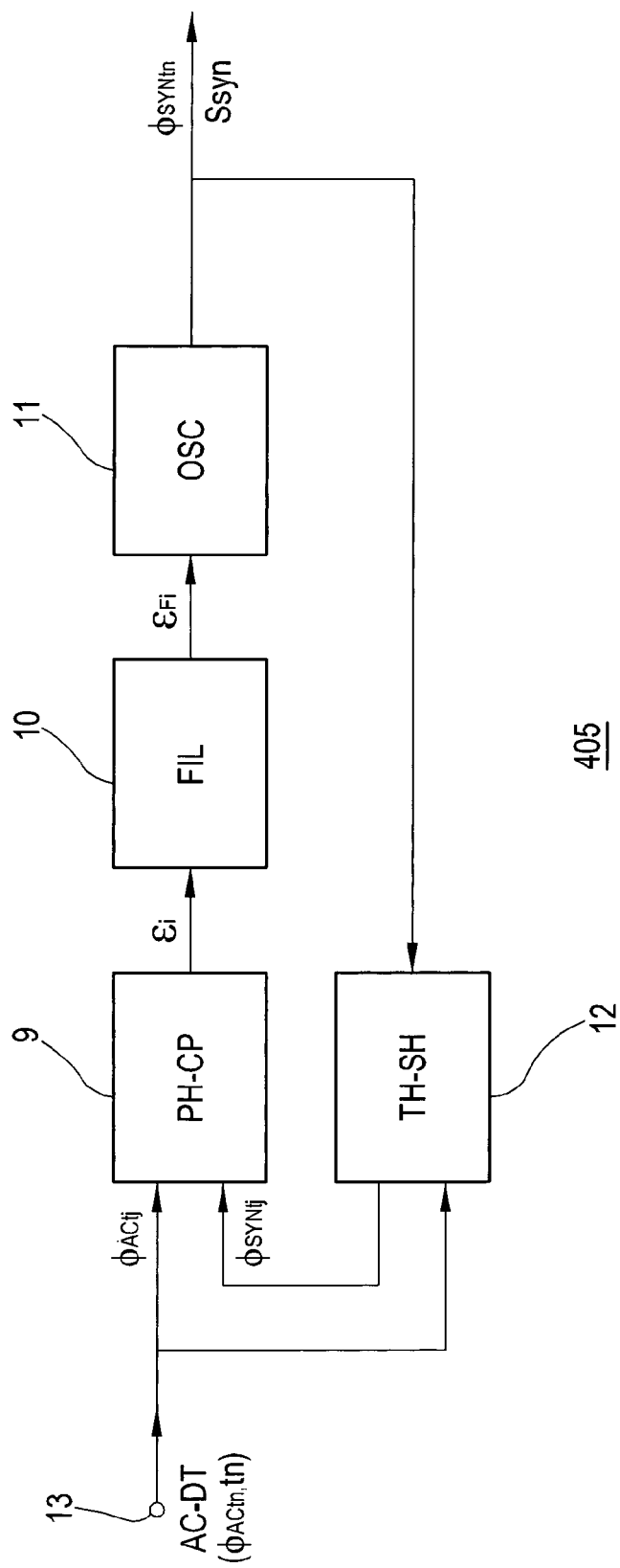
FIG. 3 shows an embodiment of a controlled frequency synthesiser included in the acquisition and processing device of FIG. 2.

In accordance with a first embodiment schematically shown in FIG. 3, the controlled frequency synthesiser 405 is a digital module and comprises: a phase comparator 9 (PH-CP), an optional filter module 10 (FIL) and a oscillator 11 (OSC). The oscillator 11 is configured to generate the synthetized phase values $\phi_{SYNm}$ representing the synthesised synchronization signal $S_{syn}$ and is adjustable according to phase errors $\varepsilon_{ti}$ provided at its input. The phase comparator 9 is configured to compute said phase errors $\varepsilon_{ti}$ from the synthetized phase values $\phi_{SYNm}$, the detected synchronization phase values $\phi_{Actn}$ and the corresponding timestamps $t_n$.

In greater detail, the controlled frequency synthesiser 405 is provided with an input 13 to receive input data AC-DT (i.e. detected synchronization phase values $\phi_{ACtn}$ and timestamps representing reference time values $t_n$) obtained from the synchronization detection apparatus 200. The oscillator 11 can be a low frequency synthesizer structured to generate a periodic digital waveform forming the synthesised synchronization signal $S_{syn}$. Particularly, the oscillator 11 can be a DDS, configured to generate a signal with a frequency in the range 0.01 Hz to 10 KHz. The phase and frequency of the signal generated by the oscillator 11 can be fine-tuned according the results provided by the phase comparator 9. The phase comparator 9 comprises a first input connected to the input 13 to receive detected synchronization phase values $\phi_{ACtn}$ and a second input to receive comparison phase values $\phi_{SYNtm}$, from a phase time shifter 12. Moreover, the phase comparator 9 is configured to provide, on a corresponding output, phase error values $\varepsilon_i$ computed as the difference between the phase values at its input.

The phase time shifter 12 is structured to receive the past time value $t_j$ from the input data AC-DT associated with a detected synchronization phase value $\phi_{Actj}$ which is at the input of the phase comparator 9 at a current time Moreover, the phase time shifter 12 is adapted to select among the synthetized phase values $\phi_{SYN}$ a past synthetized phase value $\phi_{SYNtj}$ generated at said past time value $t_j$ and provide said selected past synthetized phase value $\phi_{SYNtj}$ as comparison value to the phase comparator 9. The optional filter module 10 can be a low pass filter or an integrator, and is configured to filter the phase error values $\varepsilon_i$, so avoiding abrupt phase transition at its output and mitigate a possible sporadic reception of AC electrical voltage samples, by producing filtered error values $\varepsilon_{Fi}$.

Figure 4:
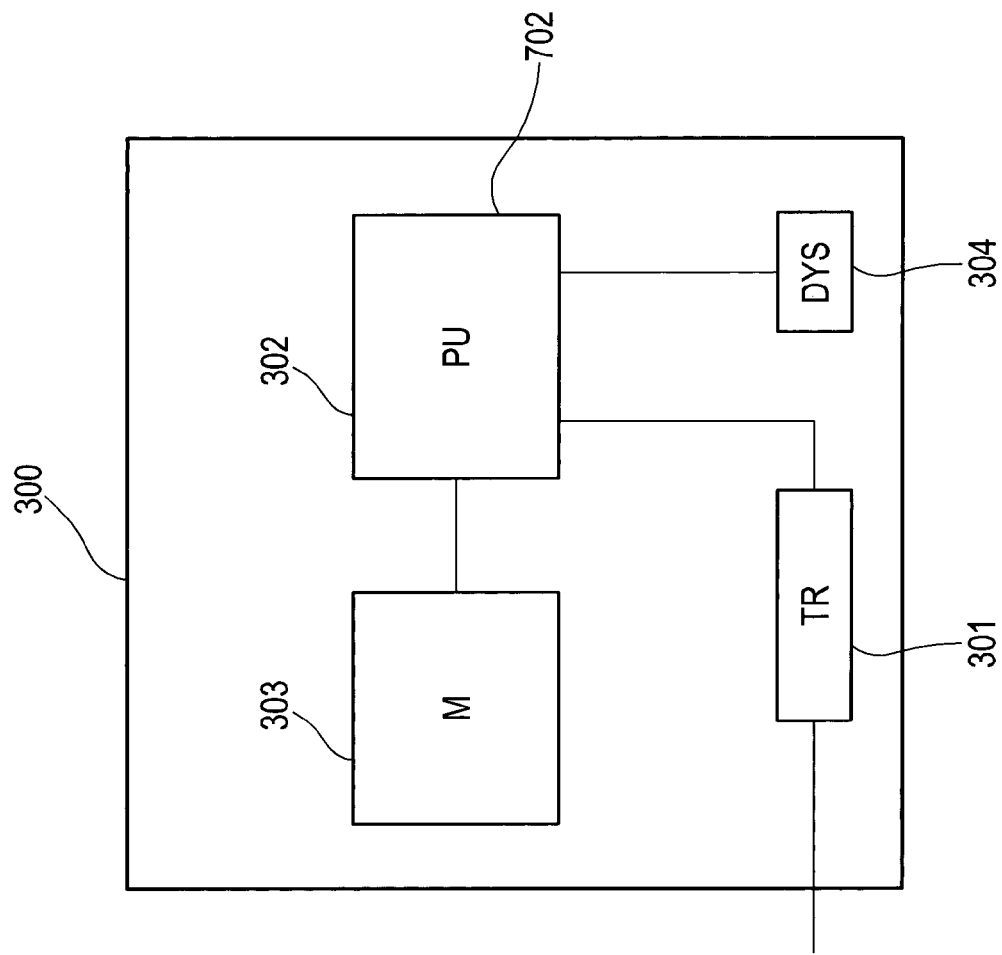
FIG. 4 shows an example of a display included in the partial discharge acquisition and visualization apparatus of FIG. 1.

Referring now the display 300 (FIGS. 1 and 4), it comprises in accordance with a particular embodiment the following modules/devices: a transceiver 301 (TR) to exchange data/commands with the acquisition and processing device 400, as an example, via the second network interface module 407, a further processing unit 302 (PU), a memory module 303 (M), a display and interface module 304 (DYS), such as a keyboard and/or a touch screen. The display 300 also allows receiving digital data DS from the acquisition and processing device 400. Particularly, the digital data DS include the partial discharge amplitude values $A_{PDn}$, the synthetized phase values $\phi_{SYNtm}$, and the timestamps $t_n$. The display 300 is structured to produce a phase resolved pattern in which any partial discharge amplitude value $A_{PDn}$ is associated with a phase value $\phi_{SYNtm}$ of the suitably synthesised synchronization signal $S_{syn1}$ which is synchronized with the AC electrical voltage $V_{AC}$.

As an example, the display 300 which is, as an example, provided with a GUI (Graphic User Interface) allows displaying this phase resolved pattern in which the maximum amplitude of each partial discharge pulse is plotted versus the corresponding phase value. In accordance with another example, the display 300 can be included into the acquisition and processing device 400 and operates under the control of the processing unit 412.

In accordance with a specific embodiment, a plurality of synchronization detection apparatuses 200 and a plurality of partial discharge acquisition and visualization apparatuses 500 can be employed to monitor a particular area and the network NTW can be used to localize, i.e. retrieve a list describing the location, connection type, capabilities and network address of said available apparatuses, requesting the start of the data streaming. The management of the available apparatuses can be handled by a centralized server.

The Applicant observed that the phase of the AC electrical voltage in a power grid is almost constant over a certain geographical area (up to tens or thousands of kilometres), but may slightly vary along a wider area (regions, countries, etc.). A convenient approach may be to set up a network of fixed synchronization detection apparatuses 200 distributed over a wide geographical area. In this manner, for every partial discharge acquisition and visualization apparatus 500 in a location, there will be available a substantially close phase data for reconstructing the synchronization phase.

A particular example of the operation method of the partial discharge detection system 1000 is now described. The synchronization detection apparatus 200 and the partial discharge acquisition and visualization apparatus 500 can be activated at the same time. The sensor module 201 (FIG. 1) detects the AC electrical voltage $V_{AC}$ associated with one or more of the electrical lines included into the second electrical object 103. The sampling device 203 produces from the detected AC electrical voltage $V_{AC}$ the list of detected synchronization phase values $\phi_{ACtn}$ of the detected electrical voltage phase. The first local clock 205, which is kept synchronized with the external time reference source 800, produces timestamps $t_n$. The list of detected synchronization phase values $\phi_{ACtn}$ and the corresponding timestamps $t_n$ are stored in the first local storage module 206 for future lookups or for transmission along the network NTW forming a data stream DT-STR which is sent towards the acquisition and visualization apparatus 500 by means of the first network interface module 207.

Preferably, the streaming technique implemented by the network NTW which is unidirectional, continuous and generally regular in time transmission of data, shows a latency <1 s and so makes possible real-time synchronization operations. The term "real-time synchronization operations" means that there is possible plotting the partial discharge pattern while performing the measure of the partial discharge pulses.

The data stream DT-STR transmitted along the network NTW is received by the second network interface module 407 of the acquisition and processing device 400 and the list of detected synchronization phase values $\phi_{ACtn}$ and the corresponding timestamps $t_n$, are stored in the second local storage module 406 to be used by the acquisition device 403 and/or the controlled frequency synthesizer 405. With reference to the acquisition and processing device 400, the partial discharge sensor 401 (FIG. 2) detects the discharge signals $S_d$ and converts it into the received electrical signal $S_{in}$ which is filtered and amplified by the receiving module 402 so obtaining the first partial discharge signal $S_{PD1}$ to be supplied to the acquisition device 403 which provides the converted data DTA.

The converted data DTA are sent to the digital processing module 411 and the trigger module 414 selects a list of partial discharge amplitude values $A_{PDn}$ among the converted data DTA which are greater than a threshold level and allows their memorisation in the second local storage module 406. The selected partial discharge amplitude values $A_{PDn}$ represent the amplitude values of the partial discharge electromagnetic impulsive signal $S_d$. Moreover, the second local clock 404 can provides timestamp values $t_{in}$ each associated to a corresponding amplitude values $A_{PDn}$ which can be memorised in the second local storage module 406.

The controlled frequency synthesiser 405 (FIG. 3) receives the detected synchronization phase values $\phi_{ACtn}$ and the timestamps $t_n$, generates the synthesised synchronization signal $S_{syn}$ and provides the synthetized phase values $\phi_{SYNtn}$. Particularly, at a current time a detected synchronization phase value $\phi_{Actj}$ having past timestamp $t_j$ is received by the input 13 of the controlled frequency synthesiser 405. The detected synchronization phase value $\phi_{Actj}$, generated by the synchronization detection apparatus 200 at the time $t_j$, has reached the controlled frequency synthesiser 405 at a time where $t_i > t_j$, i.e. after a latency due to the transmission along the network NTW.

It has to be noted that the latency associated with the connection along the network NTW between the synchronization detection apparatus 200 and the acquisition and processing device 400 can be unpredictable and non-constant for each data packet due either to structural reasons (propagation delay, routing, etc.), either to network protocols (use of flow control algorithms, like TPC/IP). This latency, that can be up to one or two order of magnitude greater than the period of the AC electrical voltage $V_{AC}$ (i.e. up to seconds), precludes the direct use of the incoming data for synchronization and for real-time operation, either because the data (e.g. detected phase value $\phi_{Actj}$) is already "old" when it reaches the acquisition and processing device 400 (it refers to an instant located hundredths of seconds in the past), either because of its unpredictable latency.

With reference to controlled frequency synthesiser 405, at the current time the phase time shifter 12 receives at its input the timestamp corresponding to past time value $t_j$ and so it selects among the synthetized phase values $\phi_{SYNtm}$ a past synthetized phase value $\phi_{SYNtj}$ generated at said past time value $t_j$ and provide said selected past synthetized phase value $\phi_{SYNtj}$ as comparison value to the phase comparator 9. The phase comparator 9 calculates the value of difference between the detected phase value $\phi_{Actj}$, detected at the past time $t_j$, and the past synthetized phase value $\phi_{SYNtj}$, generated at the same past time $t_j$ and generates a corresponding error phase value $\varepsilon_i$ in the current time $t_i$:

$$\varepsilon_i = \phi_{SYNtj} - \phi_{ACtj} \quad (1)$$

Figure 5:
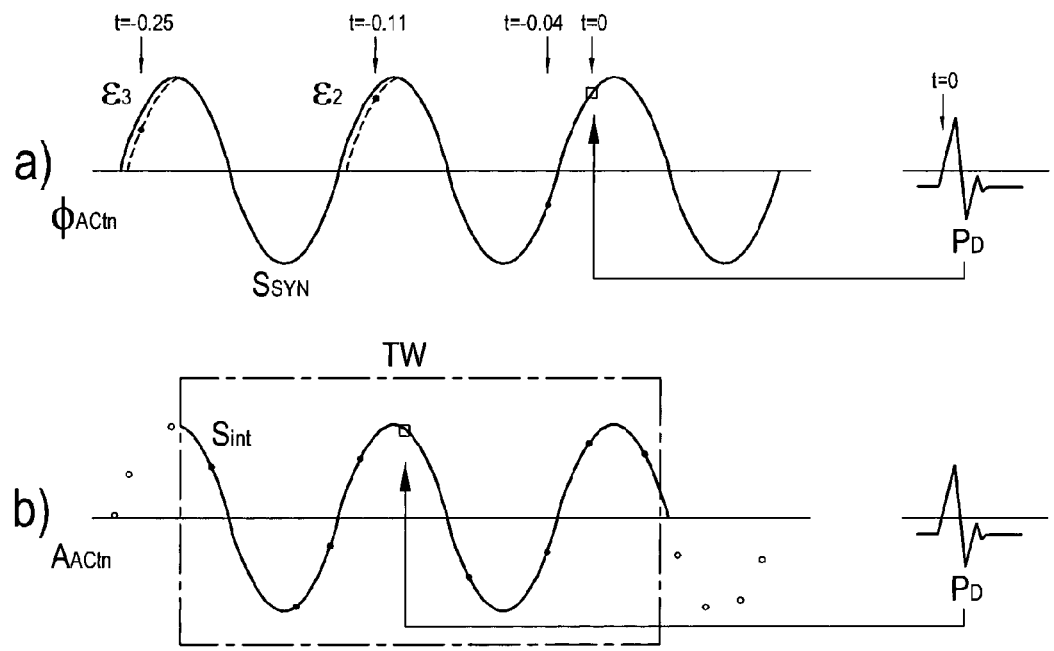
FIG. 5a illustrates an example of the trend of a synchronization synthetized signal as generated from the controlled frequency synthesiser of FIG. 3.
FIG. 5b illustrates an example of a reconstructed synchronization synthetized signal.

The computed error phase value $\varepsilon_i$, after the filtering performed by the filter module 10, is supplied to the oscillator 11 to adjust the generated synthetized phase values $\phi_{SYNtm}$. FIG. 5a shows an example of the phase adjustment performed by the controlled frequency synthesiser 405 on a synthetized synchronization signal $S_{syn}$. In greater detail, the trend of the synthetized synchronization signal $S_{syn}$, the corresponding detected phase values $\phi_{ACtm}$ and the behaviour of the partial discharge pulses PD are shown in FIG. 5a. At a third past instant $t=-0.25$ a third error $\varepsilon_3$ is calculated as in formula (1), at a second past instant $t=-0.11$ second phase error $\varepsilon_2$ lower than the third error $\varepsilon_3$ is calculated; at a first past instant $t=-0.004$ and at a current instant $t=0$ the phase error is null.

With reference to the described method, it is observed that the error phase value $\varepsilon_i$ has been calculated without the need of estimating any fixed latency associated with the network NTW. It is also noticed that due to the relatively high stability of the frequency of the AC electrical voltage $V_{AC}$, even few data values $\phi_{ACtm}$, $t_n$ are sent per second from the synchronization detection apparatus 200 to the acquisition and processing device 400 this is sufficient to guarantee a good phase synchronization between the AC electrical voltage $V_{AC}$ and the oscillator 11: this allows to reduce the requirements for the data stream (bandwidth, latency, integrity, regularity, etc.) on the network NTW and operate with (or advantageously exploit) low quality or low cost network connections. As an example, the network NTW can be a satellite network having reduced band (e.g. 56 kbps) and latency of some seconds.

Figure 6:
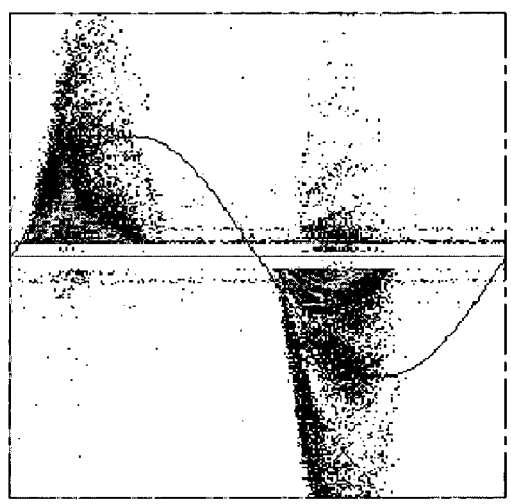
FIG. 6 is a plotting of partial discharge detected samples synchronized with a synthetized signal.

So, by using the oscillator 11 as a synchronization source, once a partial discharge pulse (i.e. the amplitude values $A_{PDn}$) is acquired, its associated phase, i.e. the synthetized phase value $\phi_{SYNtj}$, is immediately known, independently from any network or processing delay. Particularly, an amplitude value $A_{PDi}$ acquired with a timestamp $t_i$ is associated with a synthetized phase value $\phi_{SYNti}$ generated with the same timestamp $t_i$. A list of the amplitude values $A_{PDn}$ and the corresponding synthetized phase values $\phi_{SYNtm}$ is transmitted to the display 300. The further processing unit 302 of the display 300 manages the visualization on the display and interface module 304 of a plot representing the amplitude values $A_{PDn}$ at the corresponding synthetized phase values $\phi_{SYNtm}$ as shown in FIG. 6, as an example. This visualization can be made in real time i.e. contemporarily to the amplitude values $A_{PDn}$ acquisition. According to another embodiment the visualization is not performed in real-time: e.g. a list of amplitude values $A_{PDn}$ can be stored in the local storage module 206 or in the memory module 303 together with the corresponding detected synchronization phase values $\phi_{ACtm}$ and the timestamps $t_n$. Subsequently (e.g. after 2-5 seconds), these stored values can be used to compute the error phase value $\varepsilon_i$ according to formula (1), the adjustment of the generated synthetized phase values $\phi_{SYNtm}$ produced by the oscillator 11 to allow the visualization on the display and interface module 304 of the plot representing the amplitude values $A_{PDn}$ at the corresponding synthetized phase values $\phi_{SYNtm}$.

It is observed that, in accordance with a functionality additional to the use of the controlled frequency synthesiser 405, amplitude sampled values $A_{ACtm}$ of the AC electrical voltage $V_{AC}$, the detected phase values $\phi_{Actm}$ and the corresponding timestamps $t_n$ received by the acquisition and processing device 400 can be memorised in the second local storage module 406 to be employed in an a-posteriori re-synchronization of the amplitude values $A_{PDn}$. According to this example, the further processing unit 302 computes a sinusoid $S_{int}$ (FIG. 5b) interpolating a certain number of the AC electrical voltage $V_{AC}$ samples in a time window TW (e.g. less than 5 seconds) centered around each pulse timestamp, and then obtaining from this computed sinusoid the pulse angle, i.e. a phase value. This additional method needs to acquire a certain number of samples preceding and following each partial discharge pulse, so it is not well suited for fast real-time operations.

In accordance with this additional method, only AC samples around the PD pulse which gives best interpolation results are considered to compute a single interpolating sinusoid, since the grid frequency may have short time deviation but maintains a very regular average frequency (so instantaneous deviation cannot be derived from long time averages).

The Applicant has tested the possibility of generating synchronized timestamps using two identical boards implementing the first local clock 205 and the second local clock 404. Each clock circuit has been implemented on an FPGA (Field Programmable Gate Array), and tested with a clock of 50 MHz generated by a quartz oscillator, corresponding to an increment of the fast counter at 20 ns rate. The overflow of the fast counter (and so a second time) was set to 50,000,000. The two identical boards were started together and the time skew was recorded over time. Without any correction from an external common reference, so considering only free running oscillators, the deviation ranged from 60 to 2400 ns in 1 second. Moreover, by employing two different GPS receivers as time source 800 and using the 1PPS signal to correct the counters, the deviation was almost cancelled, and only a fixed offset of about 40 ns was maintained between the two oscillators. The quality of the synchronization was influenced by the quality of the received GPS signal, but in every case the skew between the two timers was almost cancelled and only an offset <100 ns was present. This experiment confirmed the adequate short term stability of the quartz oscillators and possibility to correct the timers with external references. The timer was also used to generate timestamps for simulated PD pulses with known timings. The obtained values confirmed the possibility of the system to generate timestamps with a precision better of 1 µs.

It is observed that the described partial discharge detection system 1000 allows performing the synchronization of acquired partial discharge pulses with the AC electrical voltage even if the electrical object under test does not permit local detection of the AC electrical voltage. Moreover, the use of the frequency synthesiser 205 and the described controlling technique give the possibility of performing real-time acquisition and plotting of the partial discharge pulses suitably synchronised with the remotely detected AC electrical voltage. Since the described controlling technique of the frequency synthesiser 205 does not need that large number of samples of the detected AC electrical voltage are processed, the described system can be implemented with a network showing reduced requirements for the data stream (bandwidth, latency, integrity, regularity, etc.) and low quality/cost of the network connecting the acquisition and processing device 400 to the synchronization detection apparatus 200.

The invention claimed is:

1. A partial discharge detection system comprising:
   a partial discharge acquisition and processing device comprising:
   a partial discharge detection device configured to provide a detected partial discharge electrical signal from a partial discharge pulse generated by a first electrical object;
   a first communication module configured to receive a detected synchronization signal carrying detected synchronization phase values and corresponding reference time values associated with an electrical supplying voltage of a second electrical object;
   an adjustable phase value generator configured to produce synthetized phase values representing a synthetized synchronization signal, the adjustable phase value generator being adjustable according to phase errors;
   an error computing module configured to compute said phase errors from:
   the synthetized phase values,
   the detected synchronization phase values, and
   the corresponding reference time values; and
   an acquisition device configured to receive the detected partial discharge electrical signal and the synthetized synchronization signal to synchronize the partial discharge pulse with the electrical supplying voltage.

2. The detection system of claim 1, wherein:
   the error computing module is configured to compute a current phase error from a past detected synchronization phase value associated with a past reference time value and a comparison value; and
   the partial discharge acquisition and processing device further comprises:
   a time shifter module configured to select among the synthetized phase values a past synthetized phase value generated at said past reference time value and provide said past synthetized phase value as comparison value to the error computing module.

3. The detection system of claim 2, wherein the partial discharge acquisition and processing device is placed remotely from the second electrical object.

4. The detection system of claim 2, wherein the acquisition device is configured to process the detected partial discharge electrical signal and provide partial discharge amplitude values.

5. The detection system of claim 4, further comprising:
   a display connected to the partial discharge acquisition and processing device and configured to display said partial discharge amplitude values at corresponding synthetized phase values.

6. The detection system of claim 1, further comprising a synchronization detection apparatus comprising:
   a sensor module to convert the electrical supplying voltage in a converted electrical signal;
   a synchronization processing module structured to receive the converted electrical signal and generate said detected synchronization signal by associating the detected synchronization phase values to the corresponding reference time values; and
   a second communication module configured to transmit said detected synchronization signal along a communication network connectable to said first communication module.

7. The detection system of claim 6, further comprising:
   a time reference source structured to provide a time reference signal to the partial discharge acquisition and processing device and the synchronization detection apparatus to generate said reference time values.

8. The detection system of claim 7, wherein the time reference source is selected from one of the following sources: GPS time source, stable oscillator time source, and IEEE 1588 network time source.

9. The detection system of claim 7, wherein:
   the partial discharge acquisition and processing device comprises a first local clock generator configured to produce from the time reference signal a timing signal to synchronize the acquisition device; and
   the synchronization detection apparatus comprises a second local clock generator configured to produce from the time reference signal said reference time values.

10. The detection system of claim 6, wherein:
    the sensor module is selected from one of the following devices: voltage transformer, and capacitive coupler.

11. The detection system of claim 6, wherein the communication network is selected from at least one of the following networks: a packet network, a LAN (Local Area Network), a WAN (Wide Area Network), Ethernet, WiFi, and GSM (Global System for Mobile communication)/3G network.

12. The detection system of claim 6, wherein the synchronization detection apparatus is structured to transmit a detected synchronization signal carrying synchronization detected amplitude values representing the electrical supplying voltage and associated with detected synchronization phase values and the reference time values; and
    the partial discharge acquisition and processing device is configured to generate a reconstructed synchronization signal from the detected synchronization signal by interpolation of the synchronization detected amplitude values.

13. The detection system of claim 1, wherein the partial discharge detection device is selected from one of the following sensors: contact sensor, contactless sensor, Rogowsky sensor, coupler transformer type magnetic sensor, magnetic field proximity sensor, acoustic sensor, piezoelectric sensor, and antenna sensor.

14. The detection system of claim 1, wherein the partial discharge acquisition and processing device further comprises:
a filtering module configured to filter the phase errors reducing abrupt phase transition in the synthetized phase values produced by the adjustable phase value generator.

15. The detection system of claim 1, wherein the adjustable phase value generator is configured to generate a periodic digital waveform having a frequency of said electrical supplying voltage.

16. The detection system of claim 15, wherein the adjustable phase value generator is a direct digital synthesizer, configured to generate a signal with a frequency in the range 0.01 Hz to 10 KHz.

17. A partial discharge detection method comprising:
at a first processing apparatus:
detecting a partial discharge pulse generated by a first electrical object and providing a detected partial discharge electrical signal;
receiving a detected synchronization signal carrying detected synchronization phase values and corresponding reference time values associated with an electrical supplying voltage of a second electrical object;
generating a plurality of synthetized phase values representing a synthetized synchronization signal;
computing phase errors from:
the synthetized phase values,
the detected synchronization phase values, and
the corresponding reference time values; and
adjusting phases of the plurality of synthetized phase values according to the phase errors; and
at an acquisition device:
receiving the detected partial discharge electrical signal and the synthetized synchronization signal to synchronize the partial discharge pulse with the electrical supplying voltage.

18. The detection method of claim 17, comprising:
selecting among the plurality of synthetized phase values, a past synthetized phase value generated at a past reference time value; and
wherein:
computing said phase errors comprises computing, at a current time, a current phase error from a past detected synchronization phase value associated with a past reference time value and said past synthetized phase value.

19. The detection method of claim 17, comprising, at a second processing apparatus:
converting the electrical supplying voltage in a converted electrical signal;
receiving the converted electrical signal and generating said detected synchronization signal by associating the detected synchronization phase values to the corresponding reference time values; and
transmitting toward said first processing apparatus said detected synchronization signal along a communication network.

20. The detection method of claim 17, comprising:
processing the detected partial discharge electrical signal and providing partial discharge amplitude values; and
displaying said partial discharge amplitude values at corresponding synthetized phase values.

* * * * *